(12) United States Patent
Lin et al.

(10) Patent No.: US 8,469,753 B2
(45) Date of Patent: Jun. 25, 2013

(54) PINS FOR SEMICONDUCTOR DEVICE

(75) Inventors: Shih-Tsung Lin, Taoyuan County (TW); Yu-Shi Wong, Taoyuan County (TW); Tzu-Yuan Hsu, Taoyuan County (TW); Yu-Wei Chen, Taoyuan County (TW)

(73) Assignee: Nan Ya PCB Corp., Taoyuan County (TW)

( * ) Notice: Subject to any disclaimer, the term of this patent is extended or adjusted under 35 U.S.C. 154(b) by 21 days.

(21) Appl. No.: 13/304,545

(22) Filed: Nov. 25, 2011

(65) Prior Publication Data
US 2013/0095709 A1 Apr. 18, 2013

(30) Foreign Application Priority Data
Oct. 14, 2011 (TW) .............................. 100137255 A

(51) Int. Cl.
*H01R 4/02* (2006.01)
(52) U.S. Cl.
USPC ........................................................ 439/876

(58) Field of Classification Search
USPC .................... 439/876, 884, 83, 552; 174/267, 174/94 R; 257/773
See application file for complete search history.

(56) References Cited

U.S. PATENT DOCUMENTS

| | | | | |
|---|---|---|---|---|
| 5,967,838 | A | * | 10/1999 | Wozniczka et al. ............ 439/552 |
| 6,623,283 | B1 | * | 9/2003 | Torigian et al. ................. 439/83 |
| 7,723,620 | B2 | * | 5/2010 | Kawade et al. ................ 174/267 |
| 7,893,355 | B2 | * | 2/2011 | Oh et al. ....................... 174/94 R |
| 8,142,240 | B2 | * | 3/2012 | Oh et al. ........................ 439/876 |
| 2011/0068473 | A1 | * | 3/2011 | Lee et al. ........................ 257/773 |

* cited by examiner

*Primary Examiner* — Alexander Gilman

(57) ABSTRACT

A pin for a semiconductor device is disclosed. A connection head includes a plurality of curved protruded ribs and a plurality of recessed grooves. The curved protruded ribs and recessed grooves are alternately arranged. The curved protruded ribs radially extend from the center of the connection head. A pin stem is connected to the connection head.

9 Claims, 11 Drawing Sheets

PINS FOR SEMICONDUCTOR DEVICE

CROSS REFERENCE TO RELATED APPLICATIONS

This application claims priority of Taiwan Patent Application No. 100137255, filed on Oct. 14, 2011, the entirety of which is incorporated by reference herein.

BACKGROUND OF THE INVENTION

1. Field of the Invention

The invention relates to pins, and more particularly to pins for a semiconductor device.

2. Description of the Related Art

For a semiconductor package substrate (e.g. a computer main board) with a pin grid array (PGA) package, multiple pins are welded to a surface of the semiconductor package substrate. An electronic component (e.g. a central processing unit) may be electrically connected to the semiconductor package substrate by connecting to the pins.

Generally, there are two types of conventional pins, i.e. round-head pins shown in FIG. 1 and flat-head pins shown in FIG. 2.

As shown in FIG. 1, multiple conventional round-head pins 1 are welded to a semiconductor package substrate M by solder paste S. Here, each round-head pin 1 comprises a round connection head 11 and a pin stem 12 connected to the round connection head 11. Accordingly, the round-head pins 1 can be electrically connected to the semiconductor package substrate M by welding the round connection heads 11 to the semiconductor package substrate M using the solder paste S. Moreover, although a large contact area between the round connection head 11 of each round-head pin 1 and the solder paste S provides superior bonding strength therebetween, the round connection head 11 often cannot be accurately disposed on the semiconductor package substrate M, causing the entire round-head pin 1 to tilt on the semiconductor package substrate M, and further disabling connection between the electronic component and the round-head pins 1.

As shown in FIG. 2, multiple conventional flat-head pins 2 are welded to the semiconductor package substrate M by the solder paste S as well. Here, each flat-head pin 2 comprises a flat connection head 21 and a pin stem 22 connected to the flat connection head 21. Similarly, the flat-head pins 2 can be electrically connected to the semiconductor package substrate M by welding the flat connection heads 21 11 to the semiconductor package substrate M using the solder paste S. Accordingly, although the flat connection head 21 of each flat-head pin 2 can thoroughly contact the surface of the semiconductor package substrate M and thus the flat-head pin 2 is not easily tilted on the semiconductor package substrate M, a small contact area between the flat connection head 21 and the solder paste S provides inferior bonding strength therebetween. Moreover, flux (not shown) is contained in the solder paste S. When the flat connection head 21 of each flat-head pin 2 is welded to the semiconductor package substrate M or the semiconductor package substrate M containing the multiple flat-head pins 2 needs to be proceeded with a reflow welding (or re-welding) process, the flux is often volatilized to generate voids B due to a high temperature. Here, the voids B remain in the solder paste S after the reflow welding process is performed, causing the entire flat-head pin 2 to tilt on the semiconductor package substrate M.

BRIEF SUMMARY OF THE INVENTION

A detailed description is given in the following embodiments with reference to the accompanying drawings.

An exemplary embodiment of the invention provides a pin for a semiconductor device, comprising a connection head and a pin stem. The connection head comprises a plurality of curved protruded ribs and a plurality of recessed grooves. The curved protruded ribs and recessed grooves are alternately arranged. The curved protruded ribs radially extend from the center of the connection head. The pin stem is connected to the connection head.

The connection head further comprises a plurality of channels respectively formed on the curved protruded ribs.

The distance from each channel to the center of the connection head is equal.

The level with which each curved protruded rib radially extends from the center of the connection head is equal.

The length with which each curved protruded rib radially extends from the center of the connection head is equal.

The curved protruded ribs are separated from each other by an equivalent angle.

Another exemplary embodiment of the invention provides a pin for a semiconductor device, comprising a connection head and a pin stem. The connection head comprises a flat portion, a round protruded portion, a plurality of spiral protruded ribs, and a plurality of recessed grooves. The flat portion is formed on the center of the connection head. The round protruded portion is formed on the flat portion. The spiral protruded ribs and recessed grooves are alternately arranged. The spiral protruded ribs radially extend from the flat portion. The pin stem is connected to the connection head.

The level with which each spiral protruded rib radially extends from the flat portion is equal.

The length with which each spiral protruded rib radially extends from the flat portion is equal.

The spiral protruded ribs are separated from each other by an equivalent angle.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

First Embodiment

Figure 1:
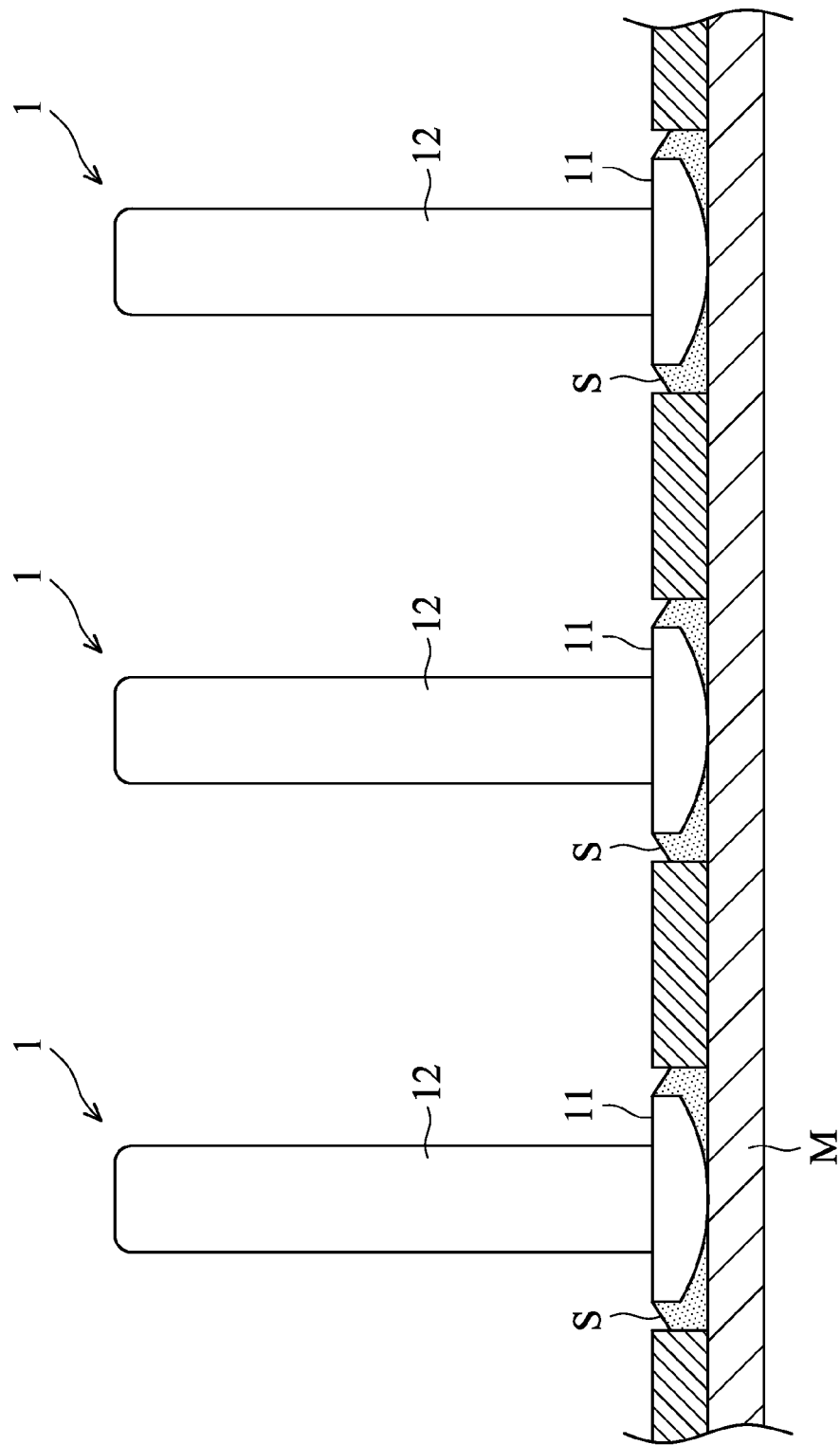
FIG. 1 is a schematic cross section of multiple conventional round-head pins combined with a semiconductor package substrate.
Figure 2:
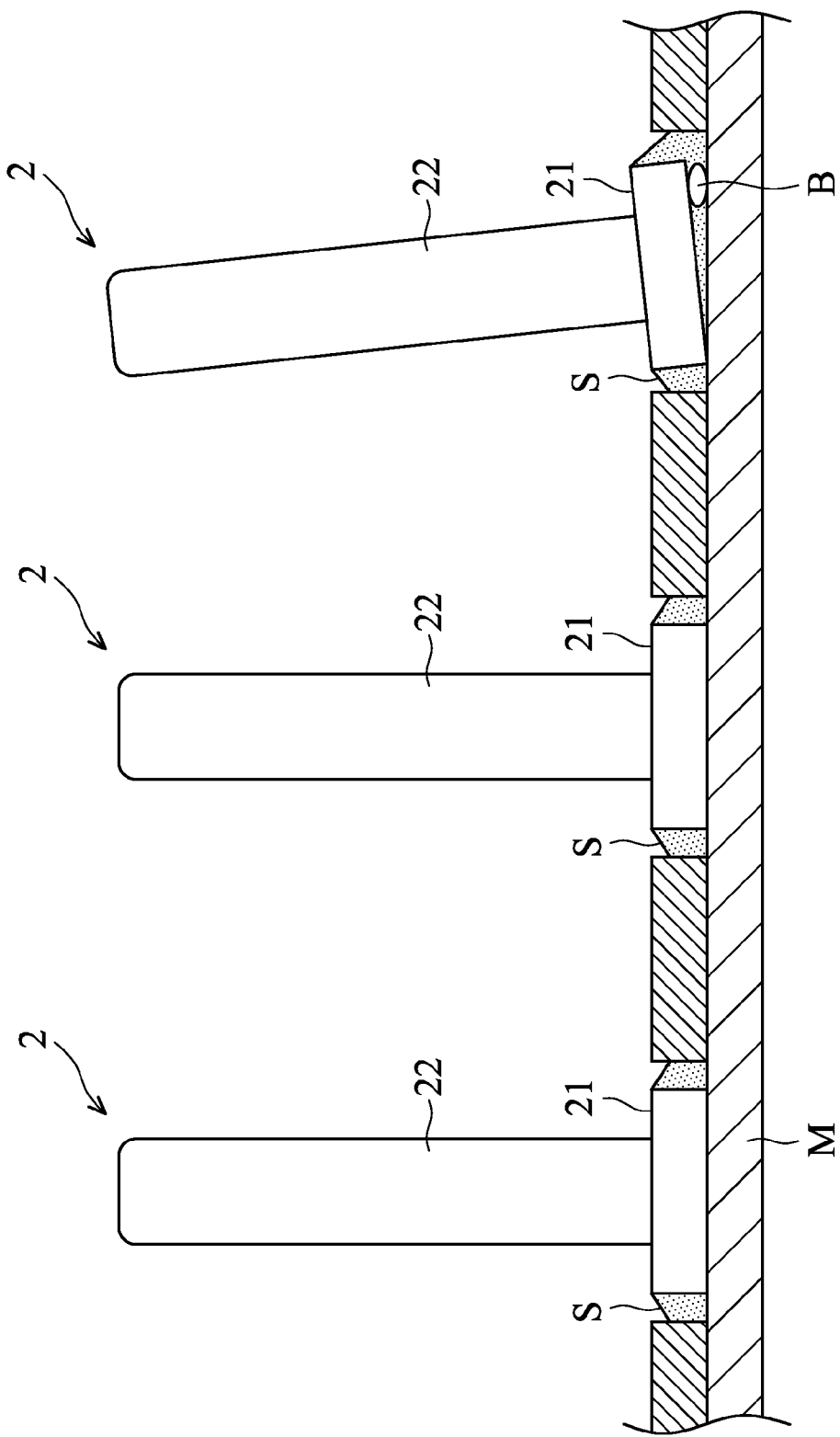
FIG. 2 is a schematic cross section of multiple conventional flat-head pins combined with a semiconductor package substrate.
Figure 3A:
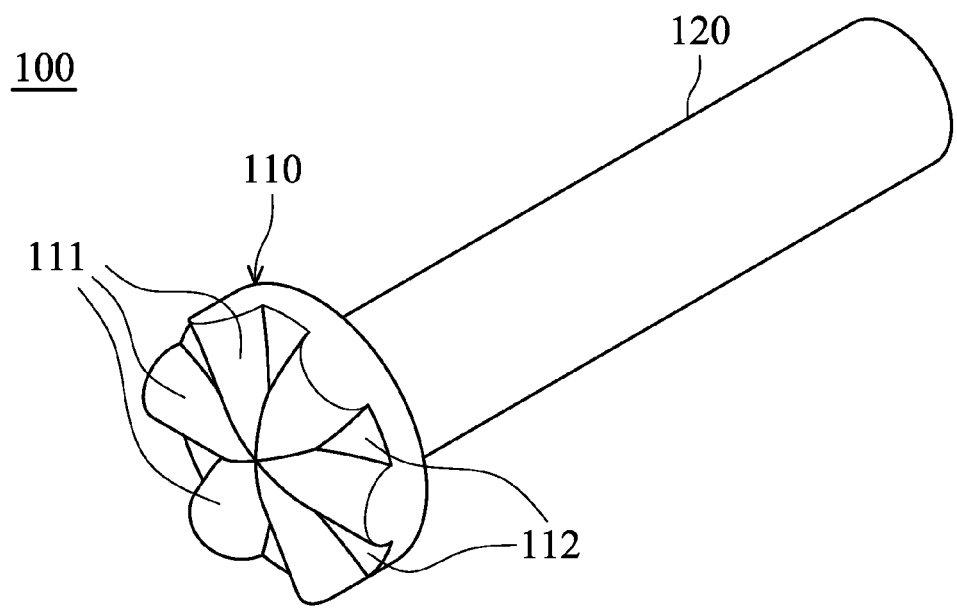
FIG. 3A is a schematic perspective view of a pin, for a semiconductor device, of a first embodiment of the invention.
Figure 3B:
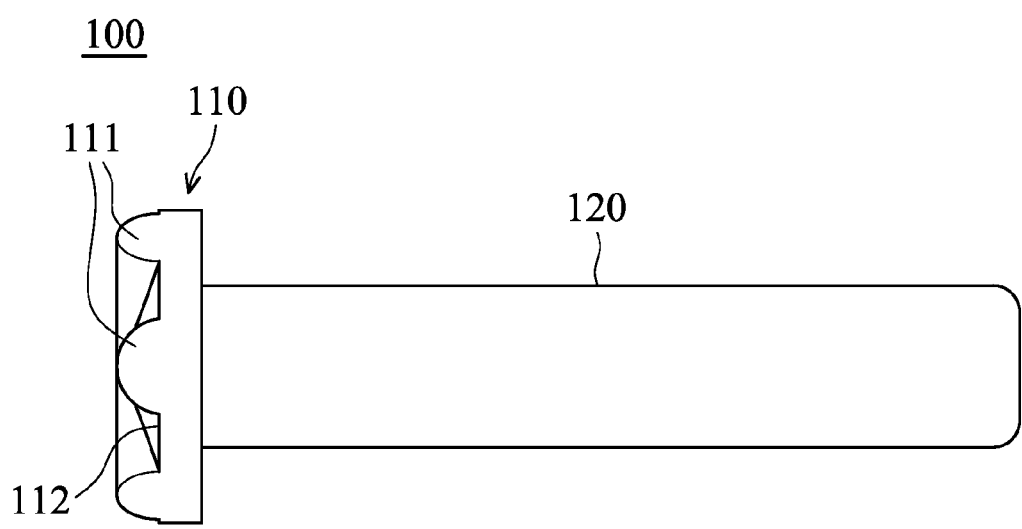
FIG. 3B is a front view of the pin of FIG. 3A.
Figure 3C:
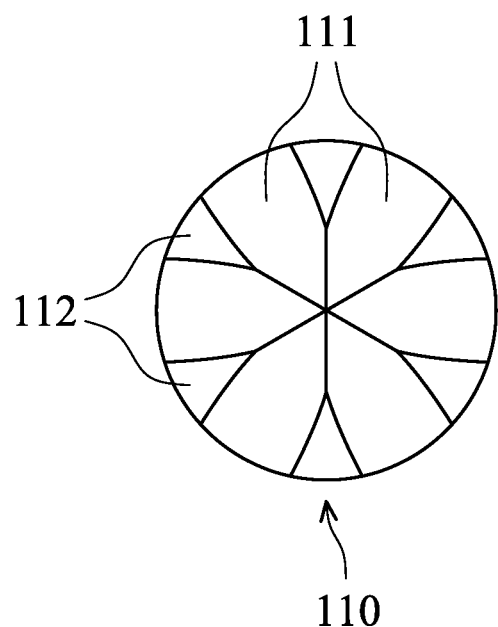
FIG. 3C is a left side view of the pin of FIG. 3A.

Referring to FIGS. 3A, 3B, and 3C, a pin 100 for a semiconductor device comprises a connection head 110 and a pin stem 120.

The connection head 110 comprises a plurality of curved protruded ribs 111 and a plurality of recessed grooves 112. Here, the curved protruded ribs 111 and recessed grooves 112 are alternately arranged, and the curved protruded ribs 111 radially extend from the center of the connection head 110. In this embodiment, the level with which each curved protruded rib 111 radially extends from the center of the connection head 110 may be equal, the length with which each curved protruded rib 111 radially extends from the center of the connection head 110 may be equal, and the curved protruded ribs 111 are separated from each other by an equivalent angle.

The pin stem 120 is connected to the connection head 110 and is used to connect to an electronic component (e.g. a main board containing slots or sockets).

Figure 4:
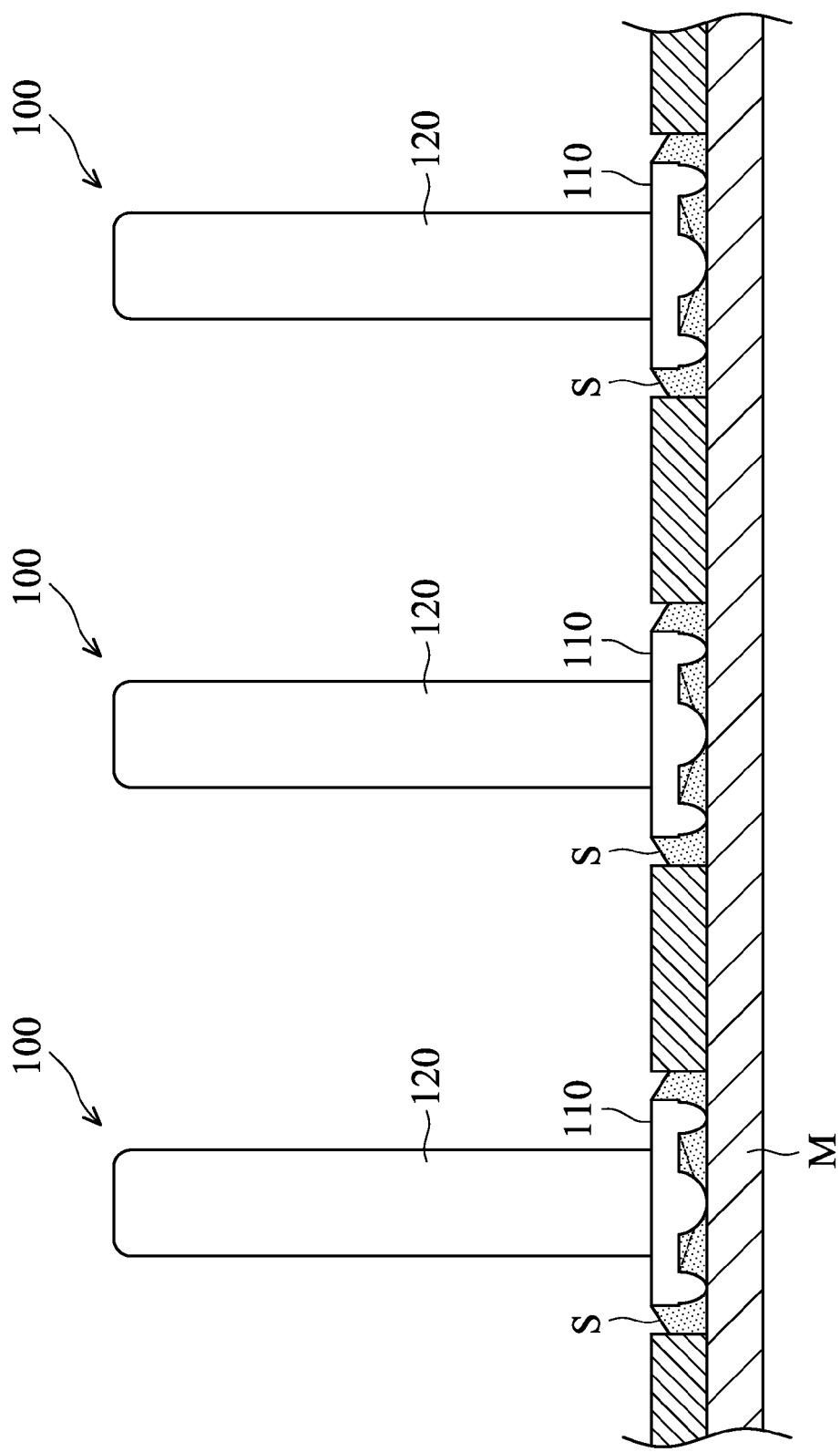
FIG. 4 is a schematic cross section of the pin, of the first embodiment of the invention, combined with a semiconductor package substrate.

As shown in FIG. 4, when the pin 100 is connected to a semiconductor package substrate M, the connection head 110 is welded to a surface of the semiconductor package substrate M by solder paste S containing flux. At this point, the pin 100 is electrically connected to the semiconductor package substrate M. Here, as the level with which each curved protruded rib 111 radially extends from the center of the connection head 110 is equal, the curved protruded ribs 111 of the connection head 110 can uniformly contact the surface of the semiconductor package substrate M, such that the pin 100 is not easily tilted. Moreover, as the connection head 110 of the pin 100 is provided with the alternately arranged curved protruded ribs 111 and recessed grooves 112, a contact area between the connection head 110 and the solder paste S is increased and thus bonding strength therebetween is enhanced. Additionally, as the connection head 110 of the pin 100 is provided with the recessed grooves 112, voids (not shown) generated from volatilization of the flux within the solder paste S due to a high temperature can be easily expelled to the exterior of the connection head 110 via the recessed grooves 112 when the connection head 110 is welded to the surface of the semiconductor package substrate M or the semiconductor package substrate M containing multiple pins 100 needs to be proceeded with a reflow welding (or re-welding) process. Thus, tilt of the entire pin 100 on the semiconductor package substrate M can be further prevented.

Second Embodiment

Elements corresponding to those in the first embodiment share the same reference numerals.

Figure 5A:
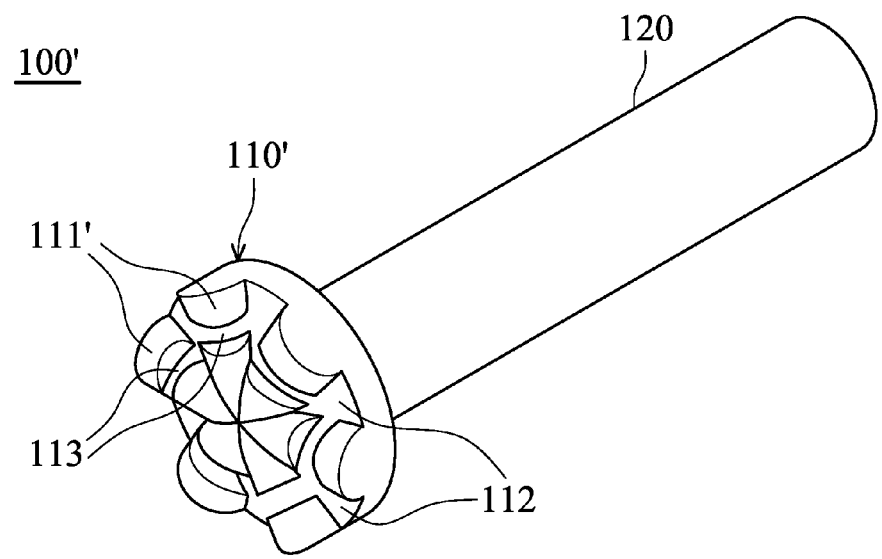
FIG. 5A is a schematic perspective view of a pin, for a semiconductor device, of a second embodiment of the invention.
Figure 5B:
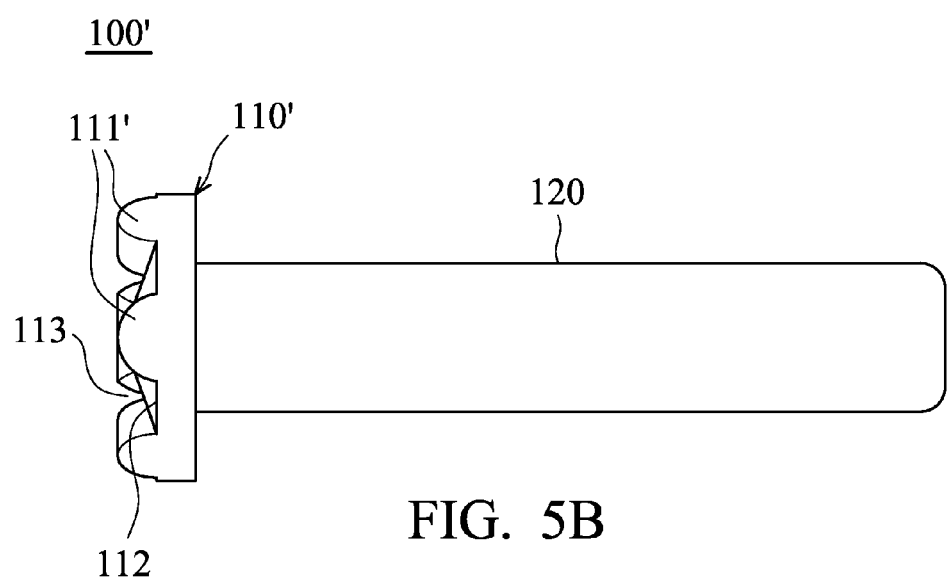
FIG. 5B is a front view of the pin of FIG. 5A.
Figure 5C:
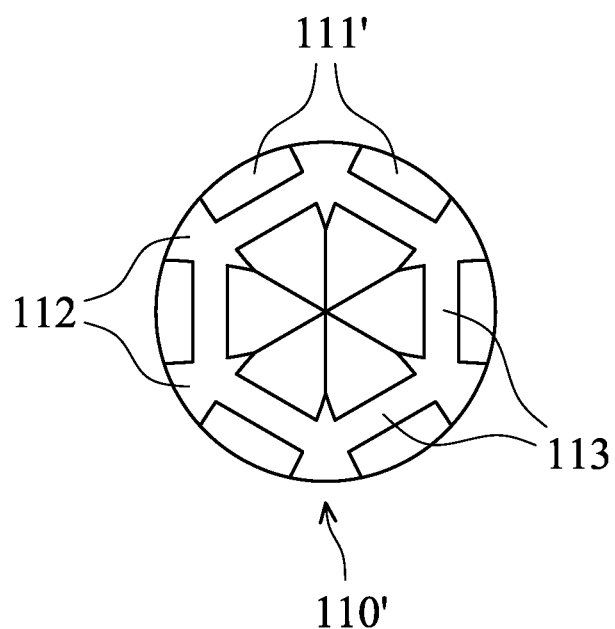
FIG. 5C is a left side view of the pin of FIG. 5A.

Referring to FIGS. 5A, 5B, and 5C, compared with the pin 100 of the first embodiment, a connection head 110' of a pin 100' for a semiconductor device further comprises a plurality of channels 113 respectively formed on a plurality of curved protruded ribs 111'.

In this embodiment, the distance from each channel 113 to the center of the connection head 110' may be equal.

Structure, disposition, and function of other elements in this embodiment are the same as those in the first embodiment, and explanation thereof is omitted for simplicity.

Figure 6:
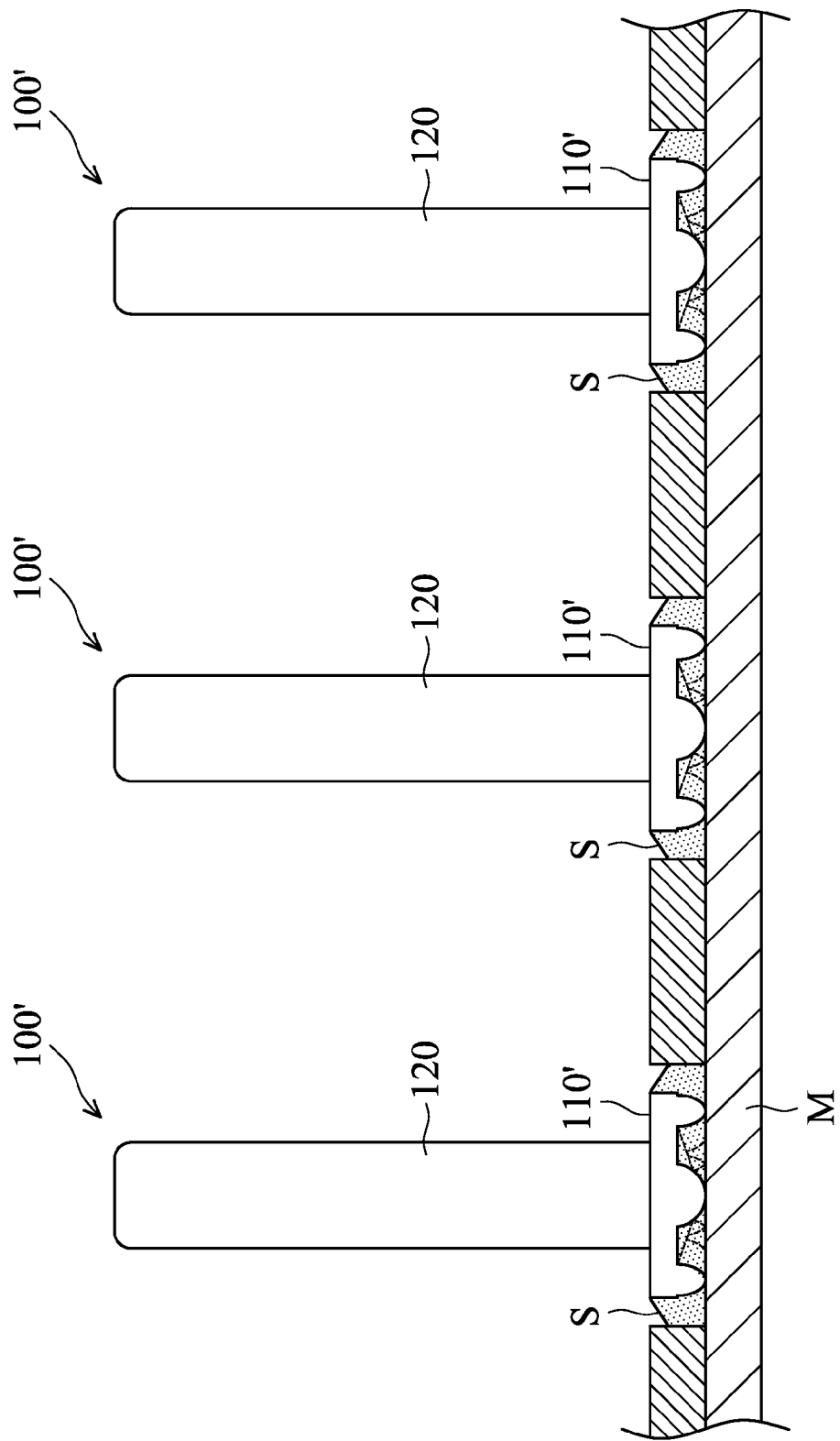
FIG. 6 is a schematic cross section of the pin, of the second embodiment of the invention, combined with a semiconductor package substrate.

As shown in FIG. 6, when the pin 100' is connected to the semiconductor package substrate M, the connection head 110' is welded to the surface of the semiconductor package substrate M by the solder paste S containing the flux. At this point, the pin 100' is electrically connected to the semiconductor package substrate M. Similarly, as the level with which each curved protruded rib 111' radially extends from the center of the connection head 110' is equal, the curved protruded ribs 111' of the connection head 110' can uniformly contact the surface of the semiconductor package substrate M, such that the pin 100' is not easily tilted. Moreover, as the connection head 110' of the pin 100' is provided with the alternately arranged curved protruded ribs 111', recessed grooves 112, and channels 113, a contact area between the connection head 110' and the solder paste S is increased and thus bonding strength therebetween is enhanced. Additionally, as the connection head 110' of the pin 100' is provided with the recessed grooves 112 and channels 113, voids (not shown) generated from volatilization of the flux within the solder paste S due to a high temperature can be easily expelled to the exterior of the connection head 110' via the recessed grooves 112 and channels 113 when the connection head 110' is welded to the surface of the semiconductor package substrate M or the semiconductor package substrate M containing multiple pins 100' needs to be proceeded with a reflow welding (or re-welding) process. Thus, tilt of the entire pin 100' on the semiconductor package substrate M can be further prevented.

Third Embodiment

Figure 7A:
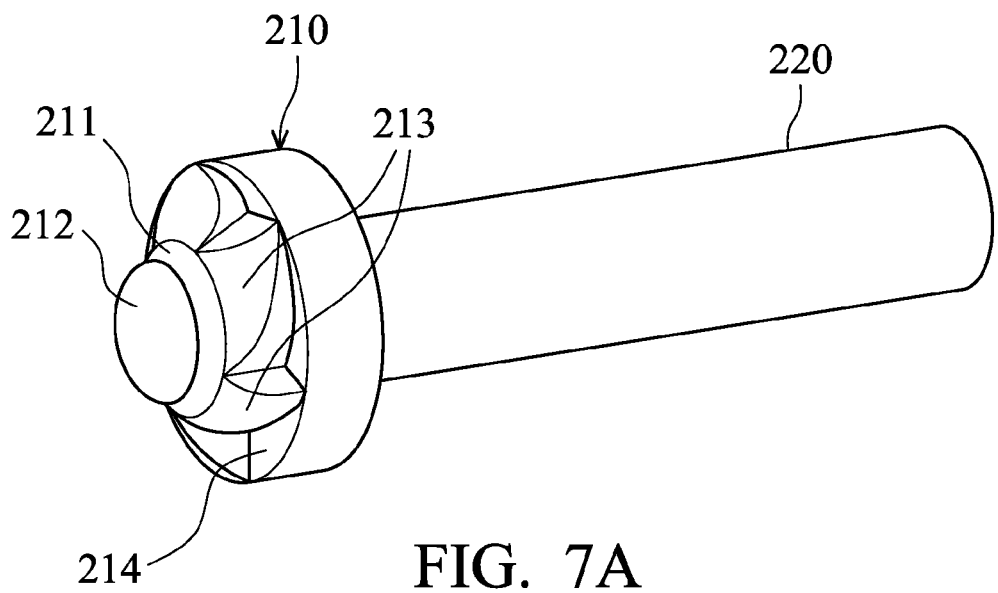
FIG. 7A is a schematic perspective view of a pin, for a semiconductor device, of a third embodiment of the invention.
Figure 7B:
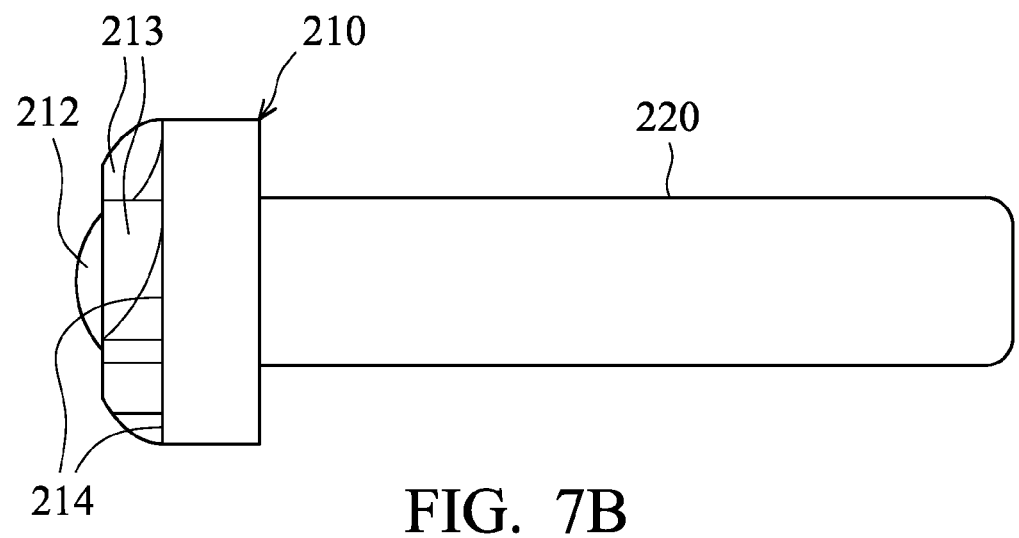
FIG. 7B is a front view of the pin of FIG. 7A.
Figure 7C:
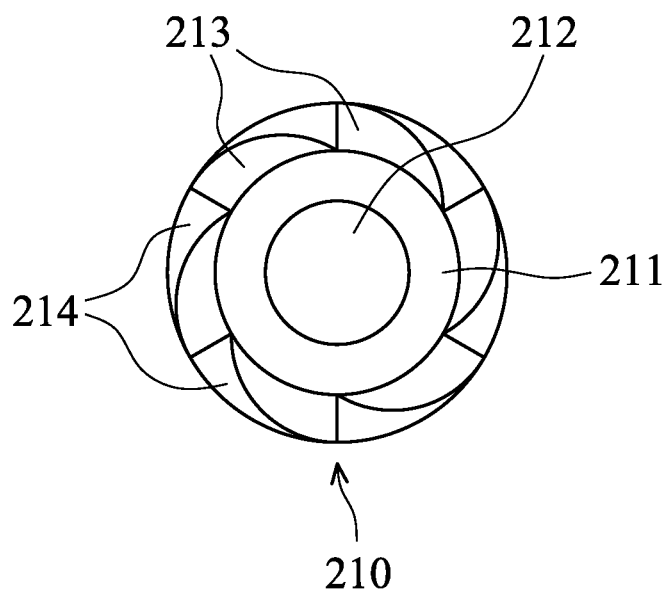
FIG. 7C is a left side view of the pin of FIG. 7A.

Referring to FIGS. 7A, 7B, and 7C, a pin 200 for a semiconductor device comprises a connection head 210 and a pin stem 220.

The connection head 210 comprises a flat portion 211, a round protruded portion 212, a plurality of spiral protruded ribs 213, and a plurality of recessed grooves 214. Here, the flat portion 211 is formed on the center of the connection head 210, the round protruded portion 212 is formed on the flat portion 211, the spiral protruded ribs 213 and recessed grooves 214 are alternately arranged, and the spiral protruded ribs 213 radially extend from the flat portion 211. In this embodiment, the level with which each spiral protruded rib 213 radially extends from the flat portion 211 is equal, the length with which each spiral protruded rib 213 radially extends from the flat portion 211 is equal, and the spiral protruded ribs 213 are separated from each other by an equivalent angle.

The pin stem 220 is connected to the connection head 210 and is used to connect to an electronic component (e.g. a main board containing slots or sockets).

Figure 8:
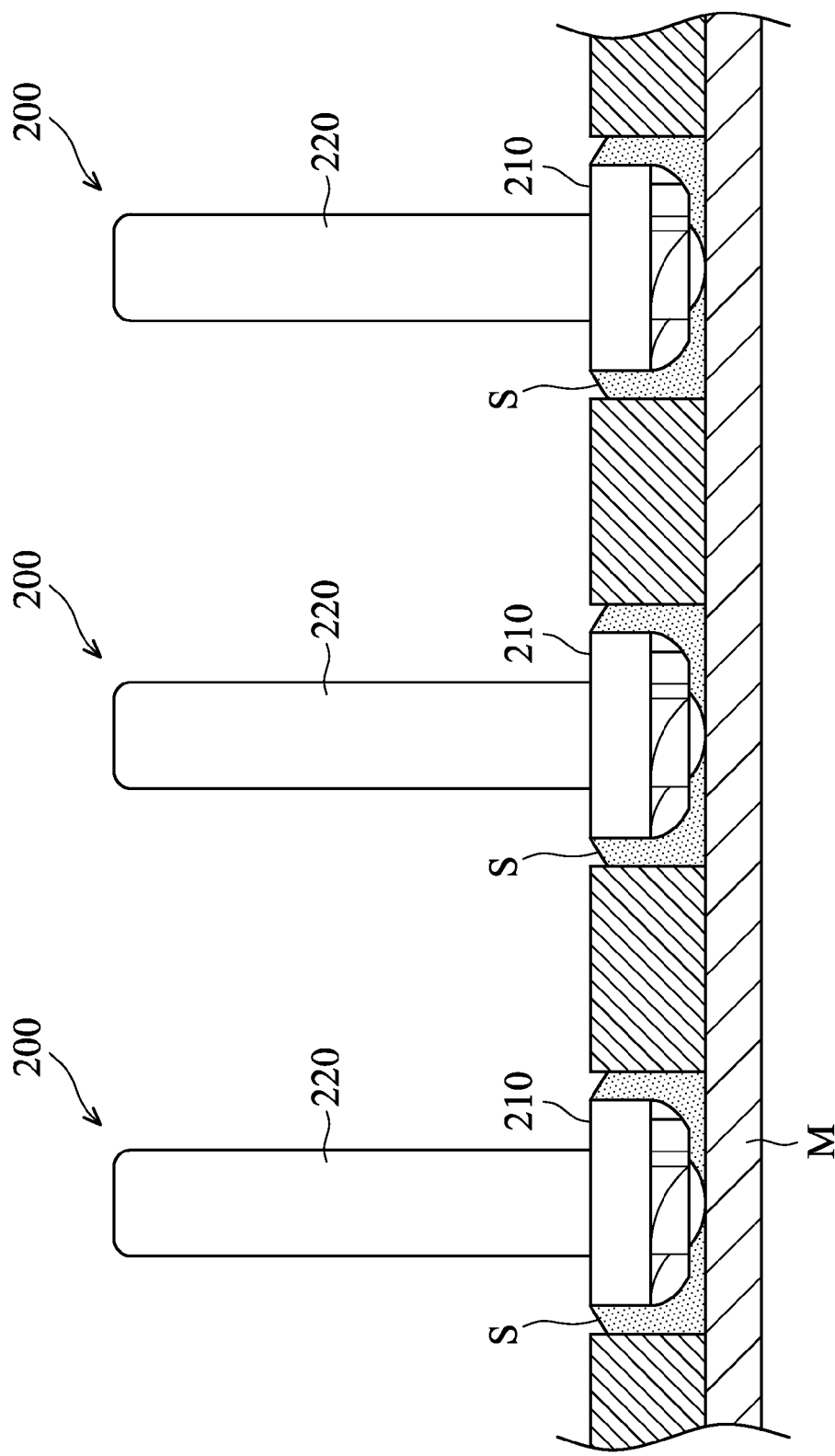
FIG. 8 is a schematic cross section of the pin, of the third embodiment of the invention, combined with a semiconductor package substrate.

As shown in FIG. 8, when the pin 200 is connected to the semiconductor package substrate M, the connection head 210 is welded to the surface of the semiconductor package substrate M by the solder paste S containing the flux. At this point, the pin 200 is electrically connected to the semiconductor package substrate M. Here, as the connection head 210 of the pin 200 comprises the round protruded portion 212 and the alternately arranged spiral protruded ribs 213 and recessed grooves 214, a contact area between the connection head 210 and the solder paste S is increased and thus bonding strength therebetween is enhanced. Additionally, as the connection head 210 of the pin 200 is provided with the recessed grooves 214, voids (not shown) generated from volatilization of the flux within the solder paste S due to a high temperature can be easily expelled to the exterior of the connection head 210 via the recessed grooves 214 when the connection head 210 is welded to the surface of the semiconductor package substrate M or the semiconductor package substrate M containing multiple pins 200 needs to be proceeded with a reflow welding (or re-welding) process. Thus, tilt of the entire pin 200 on the semiconductor package substrate M can be prevented.

In conclusion, when the disclosed pins are combined with the semiconductor package substrate, the bonding strength therebetween can be effectively enhanced and the tilt of the pins on the semiconductor package substrate can be effectively prevented.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pin for a semiconductor device, comprising:
   a connection head comprising a plurality of curved protruded ribs, a plurality of recessed grooves, and a plurality of channels, wherein the curved protruded ribs and recessed grooves are alternately arranged, and the curved protruded ribs radially extend from the center of the connection head, and the channels are respectively formed on the curved protruded ribs; and
   a pin stem connected to the connection head.

2. The pin for a semiconductor device as claimed in claim 1, wherein the distance from each channel to the center of the connection head is equal.

3. The pin for a semiconductor device as claimed in claim 1, wherein the level with which each curved protruded rib radially extends from the center of the connection head is equal.

4. The pin for a semiconductor device as claimed in claim 1, wherein the length with which each curved protruded rib radially extends from the center of the connection head is equal.

5. The pin for a semiconductor device as claimed in claim 1, wherein the curved protruded ribs are separated from each other by an equivalent angle.

6. A pin for a semiconductor device, comprising:
   a connection head comprising a flat portion, a round protruded portion, a plurality of spiral protruded ribs, and a plurality of recessed grooves, wherein the flat portion is formed on the center of the connection head, the round protruded portion is formed on the flat portion, the spiral protruded ribs and recessed grooves are alternately arranged, and the spiral protruded ribs radially extend from the flat portion; and
   a pin stem connected to the connection head.

7. The pin for a semiconductor device as claimed in claim 6, wherein the level with which each spiral protruded rib radially extends from the flat portion is equal.

8. The pin for a semiconductor device as claimed in claim 6, wherein the length with which each spiral protruded rib radially extends from the flat portion is equal.

9. The pin for a semiconductor device as claimed in claim 6, wherein the spiral protruded ribs are separated from each other by an equivalent angle.

* * * * *